United States Patent [19]
Ishizawa et al.

[11] Patent Number: 6,162,010
[45] Date of Patent: Dec. 19, 2000

[54] METHOD FOR RECOVERING OBJECT TO BE TREATED AFTER INTERRUPTION

[75] Inventors: Shigeru Ishizawa; Tatsuya Ogi; Hiroaki Mochizuki, all of Ryuo-cho, Japan

[73] Assignee: Tokyo Electron Limited, Tokyo-To, Japan

[21] Appl. No.: 09/099,784

[22] Filed: Jun. 19, 1998

[30] Foreign Application Priority Data

Jun. 23, 1997 [JP] Japan ................................ 9-181731

[51] Int. Cl.⁷ .......................... H01L 21/02; B65G 49/07
[52] U.S. Cl. ......................... 414/805; 414/217; 414/937; 414/939
[58] Field of Search ..................... 414/217, 416, 414/937, 939, 800, 805; 118/719; 204/298.25, 298.35; 156/345

[56] References Cited

U.S. PATENT DOCUMENTS

| | | | |
|---|---|---|---|
| 5,210,041 | 5/1993 | Kobayashi et al. | 438/7 |
| 5,288,379 | 2/1994 | Namiki et al. | 414/939 X |
| 5,474,410 | 12/1995 | Ozawa et al. | 414/939 X |
| 5,611,655 | 3/1997 | Fukasawa et al. | 414/939 X |
| 5,740,034 | 4/1998 | Saeki | 414/939 X |
| 5,766,360 | 6/1998 | Sato et al. | 204/298.25 X |
| 5,820,692 | 10/1998 | Baecker et al. | 414/217 X |
| 5,900,105 | 5/1999 | Toshima | 414/939 X |

FOREIGN PATENT DOCUMENTS

| | | |
|---|---|---|
| 59-175740 | 10/1984 | Japan . |
| 61-267623 | 11/1986 | Japan . |
| 4-127555 | 4/1992 | Japan . |
| 521307 | 1/1993 | Japan . |
| 6-5688 | 1/1994 | Japan . |
| 684739 | 3/1994 | Japan . |
| 94014185 | 6/1994 | WIPO ............................ 414/939 |

Primary Examiner—Steven A. Bratlie
Attorney, Agent, or Firm—Smith, Gambrell & Russell, LLP

[57] ABSTRACT

To a common transfer chamber 102 of a treatment system 100, a treatment chamber 104a of an etching system 104, treatment chambers 106a and 108a of first and second CVD systems 106 and 108, a cooling chamber (a post-treatment chamber) 110a of a cooling system 110, and first and second cassette chambers 112 and 114 are connected. In the common transfer chamber 102, a transport arm 118 and a positioning system 120 are arranged. When the treatment system 100 is restarted after being stopped during a treatment, wafers W are sequentially recovered into a cassette 116 on the basis of the control of an operation storage device, which stores therein the origin data and destination data of the wafers W. At this time, the wafers W heated to a very high temperature by a thin film deposition treatment are sequentially recovered into a cassette 116 after being cooled (post-treated), and other wafers W are sequentially recovered directly into the cassette 116. Thus, there is provided a method for recovering an object to be treated, into a cassette in a desired state when a treatment system is restarted after being stopped during a treatment.

8 Claims, 4 Drawing Sheets

METHOD FOR RECOVERING OBJECT TO BE TREATED AFTER INTERRUPTION

BACKGROUND OF THE INVENTION

1. Field of the Invention

The present invention relates generally to a method for recovering an object to be treated.

2. Related Background Art

In conventional semiconductor production processes, there has been used a multi-chamber treatment system serving as a so-called cluster tool, which comprises a common transfer chamber, and various treatment chambers and cassette chambers which are arranged around the common transfer chamber to be connected thereto.

In such a treatment system, an object to be treated, which is received in a cassette housed in a cassette chamber is first transported to a common transfer chamber by means of a transport unit, such as a transport arm, which is provided in the common transfer chamber. Then, after the object is positioned by means of a positioning unit provided in the common transfer chamber, the object is transported to a predetermined treatment chamber by means of the transport arm. Then, a predetermined treatment, such as an etching treatment, is carried out for the object transported into the treatment chamber. Moreover, the object is transported to another treatment chamber via the common transfer chamber by means of the transport arm, and a predetermined treatment, such as, a thin film deposition treatment, is carried out for the object. Thereafter, the treated object is transported from the treatment chamber into a post-treatment chamber, such as a cooling chamber, via the common transfer chamber by means of the transport arm, and a cooling treatment (a post-treatment) is carried out for the object. Then, the post-treated object is returned from the post-treatment chamber to the cassette chamber via the common transfer chamber.

As described above, after the treatment, such as the etching treatment, the object is transported into another treatment chamber via the common transfer chamber by means of the transport arm since the treatment, such as the etching treatment, does not require any post-treatments in the post-treatment chamber, and then, the predetermined treatment, such as the thin film deposition treatment, is carried out for the object. On the other hand, after the treatment, such as the thin film deposition treatment, the object is transported into the post-treatment chamber, such as the cooling chamber, via the common transfer chamber by means of the transport arm since the treatment, such as the thin film deposition treatment, requires the post-treatment in the post-treatment chamber, and then, the cooling treatment (the post-treatment) is carried out for the object.

By the way, when the treatment is stopped by some cause, e.g., a power failure or a forced interruption of the power supply, during the treatment of an object, there is the problem of how to recover the object in the treatment system into the cassette, except for objects housed in the cassette in the cassette chamber. That is, when the aforementioned some cause is solved, if the object is directly recovered into the cassette without carrying out an ordinary cooling treatment (a post-treatment) immediately after the thin film deposition treatment is carried out for the object by means of, e.g., a chemical vapor deposition (CVD) system, the cassette may be deformed or melted by the heat generated in the object by the thin film deposition treatment.

Therefore, when the treatment system is restarted after the treatment is stopped as described above, the object being treated or transported must be recovered into the cassette one by one, e.g., by the operator's manual operation.

However, in a case where the object existing in the system (except for objects housed in the cassette) is recovered by the operator's manual operation as described above, it is often very difficult for the operator to recognize all of the treatment history of the respective objects, e.g., to recognize which treatment was carried out for the object on the transport arm or if no treatment was carried out therefor. Therefore, in a case where the treatment system includes, e.g., a CVD system, when the operator can not recognize the treatment history of the object, it is required to recover the object in view of the influence of heat generated by the thin film deposition treatment, i.e., in view of the time required to cool the object, so that the recovery of the object is delayed.

In addition, even if the operator can recognize the treatment history of the respective objects, it is very difficult to recognize how to recover the respective objects existing, e.g., in the treatment chamber and the post-treatment chamber, and on the positioning system and the transport arm, and to recognize the order in which the respective objects are accurately and rapidly recovered. Such recognition often relies upon the skilled operator's experience and intuition.

SUMMARY OF THE INVENTION

It is therefore an object of the present invention to eliminate the aforementioned problems in conventional methods for recovering objects to be treated, and to provide a novel and improved method for recovering an object to be treated, the method being capable of accurately and rapidly recovering the object, which exists in a treatment chamber, on a transport arm or the like, without the need of an operator's operations when a treatment system is restarted after being stopped.

In order to accomplish the aforementioned and other objects, according to one aspect of the present invention, there is provided a method for recovering an object to be treated, which is stopped in a multi-chamber treatment system during a treatment, the multi-chamber treatment system comprising: at least one treatment chamber for carrying out a predetermined treatment for the object; at least one post-treatment chamber for carrying out a post-treatment required after the treatment; at least one cassette chamber; and a common transfer chamber, which is in communication with the treatment chamber, the post-treatment chamber and the cassette chamber via gate valves and which has at least one positioning system for positioning the object and at least one transport system for transporting the object, the method comprising the steps of: determining an origin data for the object, which is stored before the treatment system is stopped, when the transport system holds the object; and recovering the object into the cassette chamber when the origin data indicates that the object originates in the cassette chamber or the positioning system. Furthermore, throughout the specification, the term "origin data" means information indicating where the object has been transported from, e.g., any one of the cassette chamber, the positioning system, the treatment chamber and the post-treatment chamber.

In this method, a transport destination of the object existing in the treatment chamber or the post-treatment chamber during a recovery operation is preferably prescribed in each of the treatment chamber and the post-treatment chamber. In addition, the object, for which an origin data is the treatment chamber, for which the transport destination is prescribed to be the cassette chamber, is preferably recovered into the cassette chamber.

The method for recovering an object to be treated, may further comprise the steps of: determining the presence of the object in the treatment chamber and the post-treatment chamber; transporting the object from the post-treatment chamber to the cassette chamber in accordance with transport destination information representative of a destination of the object to be housed, after the post-treatment is carried out for the object in the post-treatment, when the object exists in the post-treatment chamber; transporting the object from the treatment chamber to the post-treatment chamber when the object exists in the treatment chamber, for which a transport destination on the basis of the transport destination information is prescribed to be the post-treatment chamber, and transporting the object from the post-treatment chamber to the cassette chamber after the post-treatment is carried out for the object; and transporting the object from the treatment chamber to the cassette chamber when the object exists in the treatment chamber, for which a transport destination on the basis of the transport destination information is prescribed to be the cassette chamber.

According to another aspect of the present invention, there is provided a method for recovering an object to be treated, which is stopped in a multi-chamber treatment system during a treatment, the multi-chamber treatment system comprising: at least one treatment chamber for carrying out a predetermined treatment for the object; at least one post-treatment chamber for carrying out a post-treatment required after the treatment; at least one cassette chamber; and a common transfer chamber, which is in communication with the treatment chamber, the post-treatment chamber and the cassette chamber via gate valves and which has at least one positioning system for positioning the object and at least one transport system for transporting the object, the method comprising the steps of: determining destination data for the object which is stored before the treatment system is stopped, when the transport system holds the object; and recovering the object into the cassette chamber when the destination data indicates that the destination of the object is the cassette chamber or the positioning system. Furthermore, throughout the specification, the term "destination data" means information indicating where the object is transported to, e.g., any one of the positioning system, the treatment chamber, the post-treatment chamber and the cassette chamber.

The method for recovering an object to be treated, may further comprise the steps of: determining the presence of the object in the treatment chamber and the post-treatment chamber; transporting the object from the post-treatment chamber to the cassette chamber in accordance with a transport destination information representative of a destination of the object to be housed, after the post-treatment is carried out for the object in the post-treatment, when the object exists in the post-treatment chamber; transporting the object from the treatment chamber to the post-treatment chamber when the object exists in the treatment chamber, for which a transport destination on the basis of the transport destination information is prescribed to be the post-treatment chamber, and transporting the object from the post-treatment chamber to the cassette chamber after the post-treatment is carried out for the object; and transporting the object from the treatment chamber to the cassette chamber when the object exists in the treatment chamber, for which a transport destination on the basis of the transport destination information is prescribed to be the cassette chamber.

According to a further aspect of the present invention, there is provided a method for recovering an object to be treated, which is stopped in a multi-chamber treatment system during a treatment, the multi-chamber treatment system comprising: at least one treatment chamber for carrying out a predetermined treatment for the object; at least one post-treatment chamber for carrying out a post-treatment required after the treatment; at least one cassette chamber; and a common transfer chamber, which is in communication with the treatment chamber, the post-treatment chamber and the cassette chamber via gate valves and which has at least one positioning system for positioning the object and at least one transport system for transporting the object, the method comprising the steps of: determining the presence of the object in the treatment chamber and the post-treatment chamber when the transport system does not hold the object; transporting the object from the post-treatment chamber to the cassette chamber in accordance with transport destination information representative of a destination of the object to be housed, after the post-treatment is carried out for the object in the post-treatment, when the object exists in the post-treatment chamber; transporting the object from the treatment chamber to the post-treatment chamber when the object exists in the treatment chamber, for which a transport destination on the basis of the transport destination information is prescribed to be the post-treatment chamber, and transporting the object from the post-treatment chamber to the cassette chamber after the post-treatment is carried out for the object; and transporting the object from the treatment chamber to the cassette chamber when the object exists in the treatment chamber, for which a transport destination on the basis of the transport destination information is prescribed to be the cassette chamber.

The method for recovering an object to be treated, may further comprise the steps of: determining an elapsed time from the stopping to the restarting of the treatment system; and recovering the object, which requires a post-treatment, into the cassette chamber without passing through the post-treatment chamber when the elapsed time is longer than a preset period of time.

The method for recovering an object to be treated, may further comprise a step of determining that the object during the treatment does not exist in the post-treatment chamber, by means of the transport system, which does not hold the object, before the object is transported from the treatment chamber to the post-treatment chamber.

The object may be recovered into the original slot of a cassette in the cassette chamber. Throughout the specification, the term "original slot" means a slot provided in a cassette, in which an object to be recovered is originally housed.

The object may be recovered into an empty slot of a cassette in the cassette chamber. Throughout the specification, the term "empty cassette" means a slot provided in a cassette, other than the original slot, in which no object is housed.

The multi-chamber treatment system may have a plurality of treatment chambers, each of which comprises a treatment chamber for carrying out a treatment requiring a post-treatment in the post-treatment chamber after a treatment, and a treatment chamber requiring no post-treatment in the post-treatment chamber after the treatment.

When the object is recovered in the multi-chamber treatment system stopped during the treatment, the recovery is carried out on the basis of the following guidance.

For example, when an object to be treated is stopped in a treatment chamber for carrying out a treatment, such as an etching treatment, which does not requires a post-treatment in a post-treatment chamber, the treatment in the treatment chamber is not sufficiently carried out. Therefore, the object is treated as a defective object to be recovered into a cassette chamber without being transported to the post-treatment chamber.

For example, when an object to be treated is stopped in a treatment chamber for carrying out a treatment, such as a thin film deposition treatment, which requires a post-treatment in a post-treatment chamber, the treatment in the treatment chamber is not sufficiently carried out. Therefore, the object is treated as a defective object to be recovered into a cassette chamber after being transported to the post-treatment chamber to be post-treated therein.

For example, when an object to be treated is stopped in a post-treatment chamber for carrying out a post-treatment, such as the temperature reduction of the object, the treatment of the object carried out in a treatment chamber before being transported to the post-treatment chamber is regarded to be effective, and the object is treated as a good object to be recovered into a cassette chamber after continuing the post-treatment in the post-treatment chamber again.

When the transport system in the common transfer chamber is stopped while holding the object, there is classification as follows. That is, when the object is transported from the positioning system or the cassette chamber to be held on the transport system, no treatment is carried out for the object. Therefore, the object is recovered into the cassette chamber for a new treatment without being treated as a defective object. When the object is transported from the post-treatment chamber to be held on the transport system, the post-treatment is completed. Therefore, the object is treated as a post-treated good object to be recovered into the cassette chamber. When the object is transported from the treatment chamber requiring the post-treatment to be held on the transport system, the treatment in the treatment chamber is completed. Therefore, the object is transported into the post-treatment chamber to be post-treated, and then, the object is treated as a post-treated good object to be recovered into the cassette chamber. When the object is transported from the treatment chamber requiring no post-treatment to be held on the transport system, the treatment in the treatment chamber is completed. Therefore, the object is treated as a good object to be recovered into the cassette chamber without being transported into the post-treatment chamber, and the treatment system waits for a new command for treatment.

When the treatment system is stopped while the object exists in the positioning system in the common transfer chamber, the object is transported from the cassette chamber, and no treatment is carried out for the object. Therefore, the object is recovered into the cassette chamber for a new treatment without being treated as a defective object.

BRIEF DESCRIPTION OF THE DRAWINGS

The present invention will be understood more fully from the detailed description given here below and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of a method for recovering an object to be treated according to the present invention, which is applied to a multi-chamber treatment system serving as a cluster tool, will be described in detail below.

Figure 1:
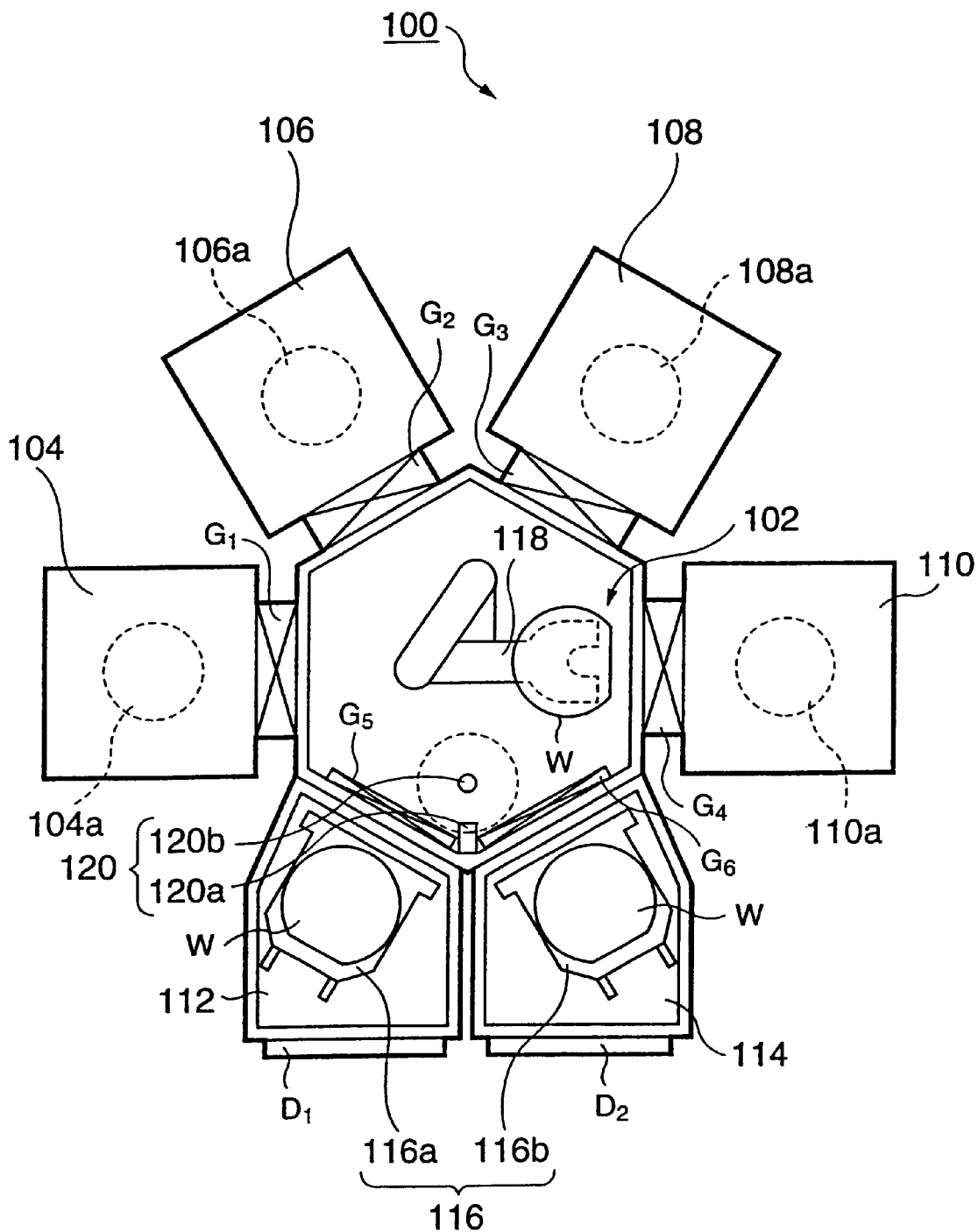
FIG. 1 is a schematic view of a multi-chamber treatment system, to which a method for recovering an object to be treated, according to the present invention, can be applied.

FIG. 1 shows a treatment system 100, to which the preferred embodiment of the present invention can be applied. The treatment system 100 is an assembly comprising a plurality of systems for sequentially carrying out a plurality of predetermined treatments for an object W to be treated, e.g., a semiconductor wafer (which will be hereinafter referred to as a "wafer"). The treatment system 100 may comprise: a common transfer chamber 102; and an etching system 104, a first CVD (thin film deposition) system 106, a second CVD system 108, a cooling system (a post-treatment system) 110, a first cassette chamber 112 and a second cassette chamber 114, which are arranged around the common transfer chamber 102. The common transfer chamber 102 is connected so as to be in communication with a treatment chamber 104a of the etching system 104, a treatment chamber 106a of the first CVD system 106, a treatment chamber 108a of the second CVD system 108, a cooling chamber (a post-treatment chamber) 110a of the cooling system 110, the first cassette chamber 112 and the second cassette chamber 114, via corresponding gate valves G1, G2, G3, G4, G5 and G6, respectively.

Each of the first and second cassette chambers 112 and 114 is designed to house therein a cassette 116 (116a, 116b) capable of simultaneously transferring a plurality of wafers W. The cassette 116 has a plurality of slots, e.g. 25 slots, each of which is capable of receiving one wafer W, so as to be capable of receiving, e.g., 25 wafers W in all. The cassettes 116a and 116b of the first and second cassette chambers 112 and 114 are provided with door valves D1 and D2, respectively, for carrying the wafers W in and out of the cassettes 116a and 116b, respectively.

In the common transfer chamber 102, a transport arm 118 comprising, e.g., an articulated arm, is provided. The transport arm 118 is arranged so as to suitably transport the wafers W, via the common transfer chamber 102, between the first cassette chamber 112, the second cassette chamber 114, the treatment chamber 104a of the etching system 104, the treatment chamber 106a of the first CVD system 106, the treatment chamber 108a of the second CVD system 108 and the cooling chamber 110a of the cooling system 110. The transport arm 118 is connected to a drive mechanism (not shown) so as to suitably carry out a predetermined operation by means of the drive mechanism.

A positioning system 120 for positioning the wafers W is provided in the common transfer chamber 102 at a predetermined position between the gate valve G5 and the gate valve G6. The positioning system 120 comprises a detection part 120a and a rotation part 120b. The positioning system 120 is designed to transfer the wafers W onto the transport arm 118 at a desired arrangement by rotating the wafers W fixed on the rotation part 120b and by stopping the rotation on the basis of the information detected by the detection part 120a.

In each of the treatment chambers (including the post-treatment chamber), i.e., in each of the treatment chambers 104a, 106a and 108a and the cooling chamber 110a, a transport destination, to which the wafers W should be transported, is prescribed. The transport destination information is prescribed to transport the wafers W to a predetermined transport destination from each of the treatment chambers 104a, 106a and 108a and the cooling chamber 110a when the recovery operation for the wafers W, which will be described later, is carried out, i.e., when the treatment system 100 is restarted. Moreover, after the wafers W are transported to the predetermined transport destination in accordance with the transport destination information, all of the wafers W in the treatment system 100 are finally recovered into the cassette 116 of the first cassette chamber 112 or the second cassette chamber 114.

The prescription of the transport destination for each of the treatment chambers 104a, 106a and 108a and the cooling chamber 110a will be described. For example, the transport destination from each of the treatment chamber 106a of the first CVD system 106 and the treatment chamber 108a of the second CVD system 108 is prescribed to be the cooling chamber 110a, and the transport destination from the treatment chamber 104a of the etching system 104 is prescribed to be any one of the first cassette chamber 112 and the second cassette chamber 114, which are capable of recovering the wafers W.

Therefore, when the recovery operation of the wafers W is carried out, the wafers W in the treatment chamber 104a are not heated to a high temperature state, so that the wafers W in the treatment chamber 104a are rapidly recovered into the cassette 116 particularly without carrying out the cooling treatment serving as a post-treatment. On the other hand, the wafers W in the treatment chamber 106a and the wafers W in the treatment chamber 108a are heated to a very high temperature, so that these wafers W are recovered into the cassette 116 after the cooling treatment serving as the post-treatment is carried out. As a result, the wafers W heated to a very high temperature are not directly recovered into the cassette 116, so that it is possible to prevent the cassette 116 from being deformed and damaged.

In addition, in a case where the wafers W exist in the cooling chamber 110a of the cooling system 110 when the treatment system 100 is restarted, the wafers W are recovered into the cassette 116 after the cooling treatment is carried out for the wafers W existing in the cooling chamber 110a. Therefore, it is possible to prevent the wafers W, for which no cooling treatment serving as a post-treatment is carried out or the cooling treatment is not completely carried out, from being directly recovered into the cassette 116.

Figure 2:
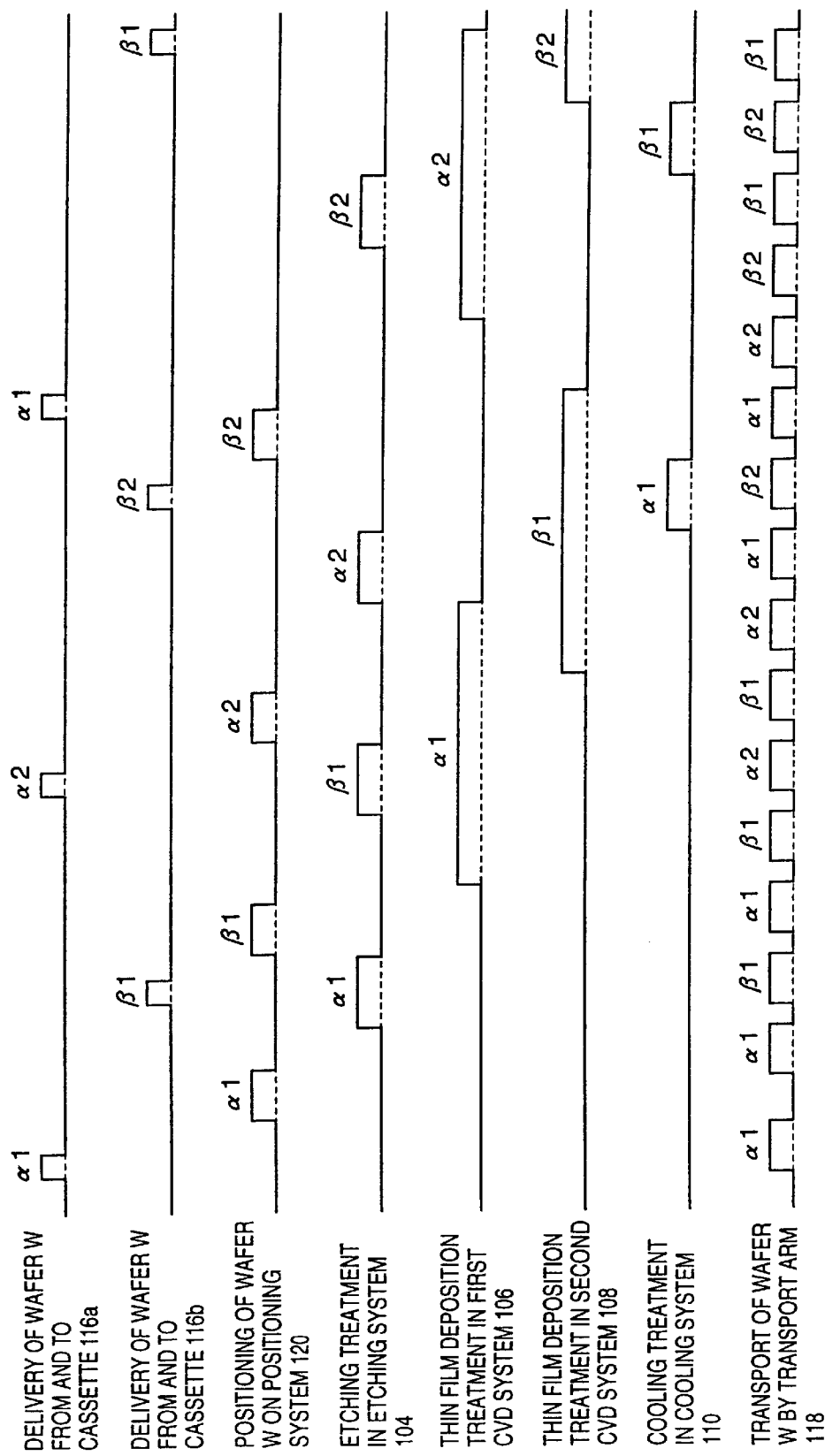
FIG. 2 is a schematic view for explaining an ordinary treatment process in the treatment system of FIG. 1.

Referring to FIG. 2, an embodiment of an ordinary treatment process in the treatment system 100 will be described below.

(1) First, wafers W ($\alpha$1) housed in the cassette 116a in the first cassette chamber 112 are transferred onto the rotation part 120a of the positioning system 120 arranged in the common transfer chamber 102 by means of the transport arm 118 to be positioned thereon.

(2) Then, the wafers W ($\alpha$1) positioned in a desired state are transported into the treatment chamber 104a of the etching system 104 by means of the transport arm 118.

(3) Then, a predetermined etching treatment, e.g., a so-called light etching treatment for arranging the treated surface of the wafers W ($\alpha$1) in a desired state, is carried out for the wafers W ($\alpha$1) in the treatment chamber 104a. During this treatment, i.e., while the etching treatment is carried out for the wafers W ($\alpha$1), wafers W ($\beta$1) housed in the cassette 116b in the second cassette chamber 114 are transported to the positioning system 120 by means of the transport arm 118 to be positioned therein in the above described manner.

(4) Thereafter, the wafers W ($\alpha$1), for which the etching treatment has been carried out, are transported from the treatment chamber 104a into the treatment chamber 106a of the first CVD system 106 via the common transfer chamber 102 by means of the transport arm 118.

(5) Then, a predetermined thin film deposition treatment is carried out for the wafers W ($\alpha$1) in the treatment chamber 106a.

Moreover, while the thin film deposition treatment is carried out for the wafers W ($\alpha$1), the positioned wafers W ($\beta$1) are transported into the treatment chamber 104a of the etching system 104 by means of the transport arm 118, and a predetermined etching treatment is carried out for the wafers W ($\beta$1).

(6) Then, while the predetermined treatments are carried out for the wafers W ($\alpha$1), ($\beta$1), wafers W ($\alpha$2) in the cassette 116a are transported to the positioning system 120 by means of the transport arm 118 to be positioned.

(7) Thereafter, the wafers W ($\beta$1), for which the etching treatment has been carried out, are transported from the treatment chamber 104a into the treatment chamber 108a of the second CVD system 108 via the common transfer chamber 102 by means of the transport arm 118, and a predetermined thin film deposition treatment is carried out for the wafers W ($\beta$1).

(8) Then, the positioned wafers W ($\alpha$2) are transported into the treatment chamber 104a of the etching system 104 by means of the transport arm 118, and a predetermined etching treatment is carried out for the wafers W ($\alpha$2).

(9) Then, the wafers W ($\alpha$1), for which the thin film deposition treatment has been carried out, are transported from the treatment chamber 106a into the cooling chamber (the post-treatment chamber) 110a of the cooling system (the post-treatment system) 110 via the common transfer chamber 102 by means of the transport arm 118, and a post-treatment, i.e., a cooling treatment (a standing cooling treatment), is carried out for the wafers W ($\alpha$1) for a predetermined period of time. By this cooling treatment, the temperature of the wafers W ($\alpha$1), which have been heated to a high temperature, e.g., a temperature of 800° C. to 1000° C., by the thin film deposition treatment, can be reduced to, e.g., room temperature (25° C.). Therefore, when the wafers W ($\alpha$1), for which the thin film deposition treatment has been carried out, are housed in the cassette 116a, it is possible to prevent the cassette 116a from melting or being deformed by the heat generated in the wafers W ($\alpha$1) by the thin film deposition treatment.

(10) Then, while the cooling treatment is carried out for the wafers W ($\alpha$1) and the thin film deposition treatment is carried out for the wafers W ($\beta$1), wafers W ($\beta$2) in the cassette 116b in the cassette chamber 114 are transported to the positioning system 120 by means of the transport arm 118 to be positioned thereon.

(11) Subsequently, the wafers W ($\alpha$1), for which the cooling treatment has been carried out, are transported from the cooling chamber 110a again into predetermined slots in the cassette 116a via the common transfer chamber 102 by means of the transport arm 118.

(12) Then, the wafers W ($\alpha$2), for which the etching treatment has been carried out, are transported from the treatment chamber 104a into the treatment chamber 106a of the first CVD system 106 via the common transfer chamber 102 by means of the transport arm 118, and a predetermined thin film deposition treatment is carried out for the wafers W (α2).

(13) Then, the positioned wafers W (β2) are transported into the treatment chamber 104a of the etching system 104 by means of the transport arm 118, and a predetermined etching treatment is carried out for the wafers W (β2).

(14) Then, the wafers W (β1), for which the thin film deposition treatment has been carried out, are transported from the treatment chamber 108a into the cooling chamber 110a of the cooling system 110 via the common transfer chamber 102 by means of the transport arm 118, and a cooling treatment is carried out for the wafers (β1).

(15) Thereafter, the wafers W (β2), for which the etching treatment has been carried out, are transported from the treatment chamber 104a into the treatment chamber 108a of the second CVD system 108 via the common transfer chamber 102 by means of the transport arm 118, and a predetermined thin film deposition treatment is carried out for the wafers W (β2).

(16) Then, the wafers W (β1), for which the cooling treatment has been carried out, are transported again into the predetermined slots of the cassette 116 by means of the transport arm 118.

(17) Thereafter, untreated wafers W housed in the cassette 116 are sequentially transported, via the common transfer chamber 102, into the treatment chambers 104a, 106a and 108a and the cooling chamber 110a by means of the transport arm 118 to be treated by predetermined treatments, and then, the wafers W are transported again into the predetermined slots in the cassette 116. Furthermore, the above described order in which the wafers W are transported is only an example for facilitating the understanding of the present invention, so that the present invention should not be limited thereto, but any transporting orders may be applied to the present invention.

The preferred embodiment of a method for recovering the wafers W according to the present invention, which can be applied to the treatment system 100, will be described in detail below.

The wafers W are sequentially treated in the treatment system 100 usually as described above. However, there are some cases where the treatment system 100 is stopped by some cause, e.g., by an interruption of the power supply or by an operator stopping the operation. In such cases, when the treatment system 100 is restarted, there is a problem in the recovery of the wafers W, particularly in the recovery of the wafers W heated to a very high temperature by the thin film deposition treatment as described above. Therefore, a method for recovering the wafers W according to the present invention is applied to the treatment system 100 to recover the wafers W into the cassette 116 as described in detail below, so that it is possible to accurately and rapidly recover the wafers W while preventing the cassette 116 from melting or being deformed.

Figure 3:
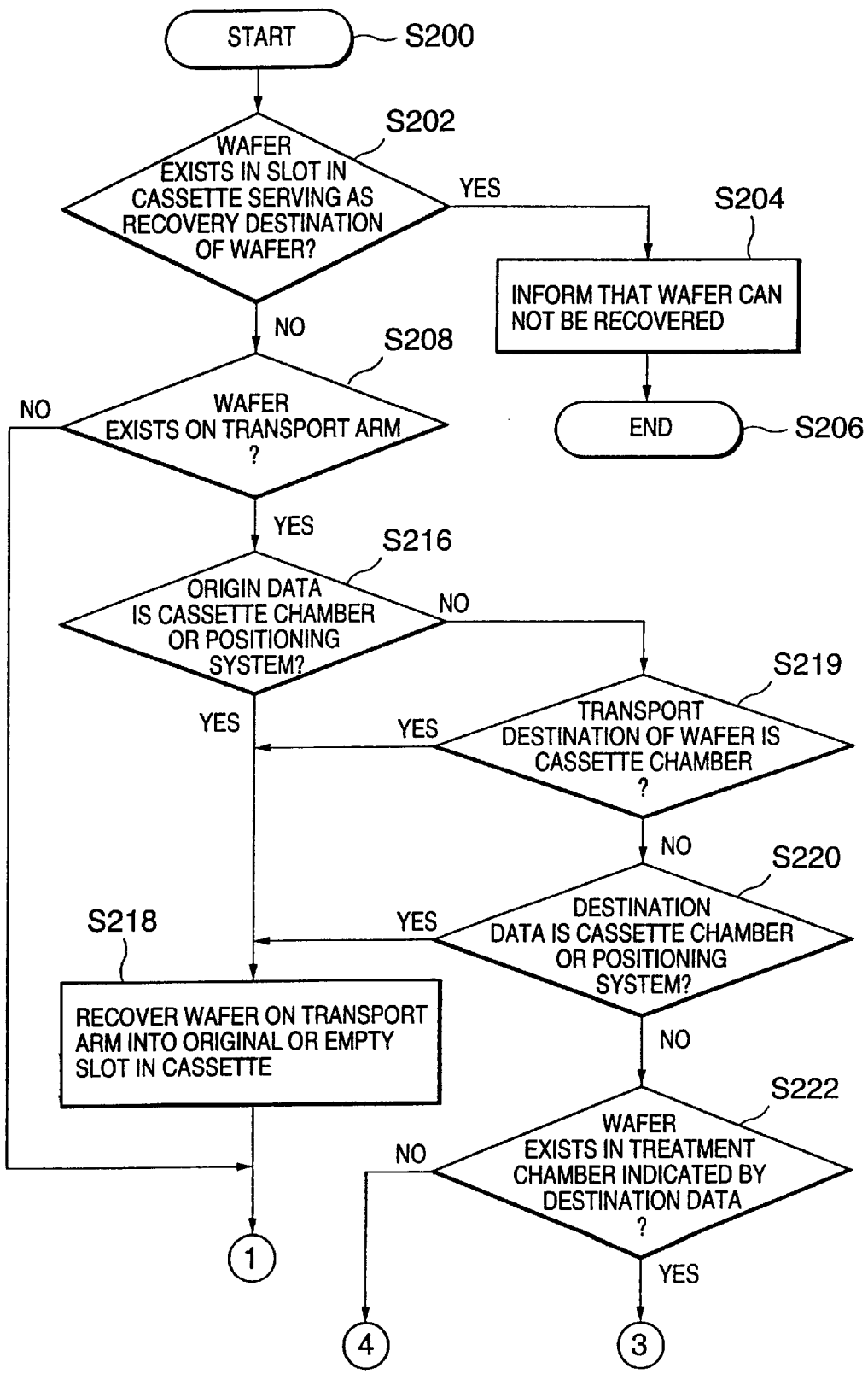
FIG. 3 is a flowchart for explaining a wafer recovery method in the treatment system of FIG. 1.
Figure 4:
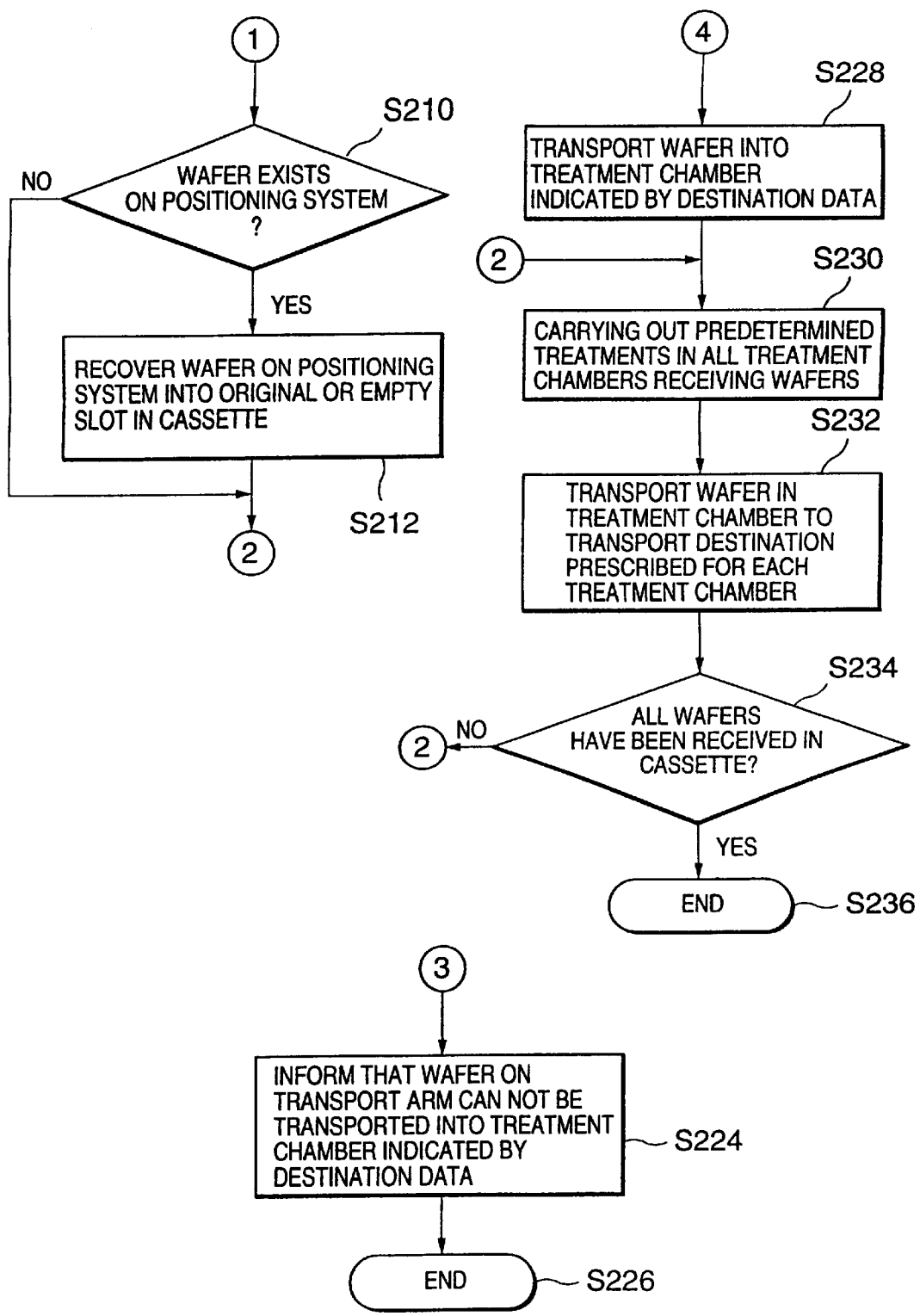
FIG. 4 is a flowchart for explaining a wafer recovery method in the treatment of FIG. 1.

Referring to the flowcharts of FIGS. 3 and 4, the preferred embodiment of a method for recovering wafers W according to the present invention will be described below.

(1) First, after the treatment system 100 is stopped by some cause as described above, when the treatment system 100 is restarted, the recovery of the wafers W into the cassette 116 is started in accordance with the method for recovering the wafers W (step S200). Furthermore, origin data and destination data for the wafers W on the transport arm 118 are always stored in an operation storage device (not shown).

(2) Then, it is determined whether the wafers W are housed in all of the slots in the cassettes 116 in the first and second cassette chambers 112 and 114 serving as recovery destinations, into which the wafers W are recovered (step S202). This determination of the presence of the wafers W in the respective slots is carried out as follows. That is, for example, optical sensors (not shown) facing each other via the slots in the cassettes 116 are arranged in the first and second cassette chambers 112 and 114 at predetermined positions. The optical sensors are moved in vertical directions (in the directions capable of detecting all of the slots), so that the presence of the wafers W is detected by the presence of light reaching the light receiving portions from the light emitting portions of the optical sensors via the slots (the light does not permeate the slot when a wafer W exists in the slot).

(3) Then, when it is determined at step S202 that wafers W are housed in all of the slots in the cassette 116, e.g., an operator or an observer (which will be hereinafter referred to as an "operator or the like") is notified that the recovery of the wafers W can not be carried out (step S204), and the recovery of the wafers W is stopped (step S206).

(4) On the other hand, when it is determined at step S202 that slots containing no wafers W exist in the cassette 116, it is determined whether wafers W exist on the transport arm 118, on the basis of the origin and destination data stored in the operation storage device, or by means of a sensor (not shown), e.g., an optical sensor, capable of detecting the presence of wafers W on the transport arm 118 (step S208).

(5) Then, when it is determined at step S208 that no wafer W is transferred onto the transport arm 118, it is determined whether wafers W exist on the positioning system 120, by detecting the presence of wafers W thereon by means of a sensor, e.g., an optical sensor, serving as the detection part 120a of the positioning system 120 (step S210).

(6) Then, when it is determined at step S210 that wafers W exist on the positioning system 120, the wafers W on the positioning system 120 are recovered into the original slots or empty slots in the cassette 116 (step S212), and step S230 described later is carried out.

(7) On the other hand, when it is determined at step S210 that no wafer W exists on the positioning system 120, the step S230 described later is carried out.

(8) When it is determined at step S208 that wafers W are transferred onto the transport arm 118, it is determined by the operation storage device whether the origin data of the wafers W is any one of the first cassette chamber 112, the second cassette chamber 114 and the positioning system 120 (step S216).

(9) Then, when it is determined at step S216 that the origin data of the wafers W on the transport 118 is any one of the first cassette chamber 112, the second cassette chamber 114 and the positioning system 120, the wafers W are recovered into the original slots or empty slots in the cassettes 116 of the first or second cassette chamber 112 or 114 (step S218).

(10) Then, after the above described step S210 is carried out and after the above described step S212 is carried out if necessary, the step S230 described later is carried out.

(11) In addition, when it is determined at step S216 that the origin data of the wafers W on the transport arm 118 is not any one of the first cassette chamber 112, the second cassette chamber 114 and the positioning system 120, i.e., when it is determined that the origin data is any one of the treatment chamber 104a, the treatment chamber 106a, the treatment chamber 108a and the cooling chamber 110a, it is determined whether the transport destination of the wafers W during the recovery operation as prescribed above is the first cassette chamber 112 or the second cassette chamber 114, i.e., the transport destination prescribed by the treatment chamber 104a of the etching system 104 or the treatment chamber 110a of the cooling system 110 (step S219).

(12) Then, when it is determined at step S219 that the transport destination of the wafers W is the first cassette chamber 112 or the second cassette chamber 114, the above described step S218 is carried out to cause the wafers W on the transport arm 118 to be recovered into the original slots or empty slots in the cassette 116 in the first cassette chamber 112 or the second cassette chamber 114.

(13) When it is determined at step S219 that the transport destination of the wafers W is not the first cassette chamber 112 or the second cassette chamber 114, it is determined by an operation controller whether the destination data of the wafers W is any one of the first cassette chamber 112, the second cassette chamber 114 and the positioning system 120 (step S220).

(14) Then, when it is determined at step S220 that the destination data of the wafers W on the transport arm 118 is any one of the first cassette chamber 112, the second cassette chamber 114 and the positioning system 120, the above described steps S218 and S210 are carried out and the above described step S212 is carried out if necessary, and thereafter, the step S230 described later is carried out.

(15) In addition, when it is determined at step S220 that the destination data of the wafers W on the transport arm 118 is not any one of the first cassette chamber 112, the second cassette chamber 114 and the positioning system 120, i.e., when the destination data is any one of the treatment chamber 104a, the treatment chamber 106a, the treatment chamber 108a and the cooling chamber 110a, it is determined whether wafers W exist in any one of the treatment chamber 104a, the treatment chamber 106a, the treatment chamber 108a and the cooling chamber 110a, which is indicated by the destination data (step S222).

This determination of the presence of the wafers W is carried out, e.g., on the basis of the information on presence of the wafers W in the treatment chamber indicated by the destination data stored before the treatment system 100 is stopped. Furthermore, a detecting means, e.g., a sensor, may be mounted on the transport arm 118 to determine the presence of the wafers W.

(16) Then, when it is determined at step S222 that wafers W exist in any one of the treatment chamber 104a, the treatment chamber 106a, the treatment chamber 108a and the cooling chamber 110a, which is indicated by the destination data, the operator or the like is notified that the wafers W on the transport arm 118 can not be transported into any one of the treatment chamber 104a, the treatment chamber 106a, the treatment chamber 108a and the cooling chamber 110a (step S224), and then, the recovery of the wafers W is stopped (step S226).

(17) In addition, when it is determined at step S222 that no wafer W exists in any one of the treatment chamber 104a, the treatment chamber 106a, the treatment chamber 108a and the cooling chamber 110a, which is indicated by the destination data, the wafers W on the transport arm 118 are transported into any one of the treatment chamber 104a, the treatment chamber 106a, the treatment chamber 108a and the cooling chamber 110a, which is the transport destination (step S228).

(18) Then, it is determined whether wafers W exist in the respective treatment chambers, i.e., the treatment chamber 104a, the treatment chamber 106a, the treatment chamber 108a and the cooling chamber 110a, and a predetermined treatment is carried out for the wafers W in each of the treatment chamber 104a, the treatment chamber 106a, the treatment chamber 108a and the cooling chamber 110a (step S230).

(19) Then, when wafers W exist in the cooling chamber 110a, the wafers W in the cooling chamber 110a are preferentially recovered into the cassette 116 in the first cassette chamber 112 or the second cassette chamber 114, and then, the recovery operation of the wafers W from any one of the treatment chamber 104a, the treatment chamber 106a and the treatment chamber 108a, in which the wafers W exist, is carried out (step S232).

As described above, this recovery operation of the wafers W is carried out on the basis of the transport destination information for the wafers W, which is prescribed for each of the treatment chambers (including the post-treatment chamber), i.e., for each of the treatment chamber 104a, the treatment chamber 106a, the treatment chamber 108a and the cooling chamber 110a. After the wafers W existing in any one of the treatment chamber 104a, the treatment chamber 106a, the treatment chamber 108a and the cooling chamber 110a are transported to a predetermined transport destination by means of the transport arm 118, all of the wafers W in the treatment system 100 are finally recovered into the cassette 116 in the first cassette chamber 112 or the second cassette chamber 114. Furthermore, when the wafers W are recovered from any one of the treatment chamber 104a, the treatment chamber 106a and the treatment chamber 108a, an electricity removing treatment serving as a post-treatment may be carried out for the wafers W.

(20) Then, until the wafers W in the treatment system 100 are recovered into the cassette 116 in the first cassette chamber 112 or the second cassette chamber 114, the above described steps S230 and S232 are sequentially repeated (step S234). When all of the wafers W in the treatment system 100 are recovered into the cassette 116, the recovery operation of the wafers W is completed (step S236).

The preferred embodiment of a method for recovering wafers W according to the present invention, which is applied to the treatment system 100, has been described above. According to this method, even if the treatment system 100 is restarted after being stopped during a treatment, wafers W existing in the treatment system 100 while being treated and transported, expect for wafers W existing in the cassette 116, can be recovered into the cassette 116 in a desired state. In particular, even if wafers W heated to a very high temperature by the thin film deposition treatment in the first CVD system 106 or the second CVD system 108, and wafers W on the transport arm 118, which are heated to a very high temperature immediately after the thin film deposition treatment, are recovered into the cassette 116, a predetermined cooling treatment is always carried out for the wafers W as described above, and thereafter, the wafers W are transported into the cassette 116. Therefore, even if the wafers W heated to a very high temperature are recovered into the cassette 116, it is possible to prevent the cassette 116 from being deformed or melted.

Furthermore, when the elapsed time from the stopping to the restarting of the treatment system 100 is longer than a preset period of time, the wafers W existing in the treatment chamber 106a or the treatment chamber 108a are directly recovered into the cassette 116 in the first cassette chamber 112 or the second cassette chamber 114 without carrying out the above described cooling treatment serving as the post-treatment. That is, when the treatment system 100 is stopped for a longer period of time than a predetermined period of time, the temperature of the wafers W in the treatment chamber 106a or the treatment chamber 108a is reduced, so that it is not required to carry out the cooling treatment serving as the post-treatment for the wafers W. Therefore, the elapsed time from the stopping to the restarting of the treatment system 100 is stored in, e.g., in a storage device (not shown), and when the elapsed time exceeds a predetermined period of time, the wafers W are recovered into the cassette 116 without carrying out the above described post-treatment for the wafers W.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

For example, in the above described preferred embodiment, while wafers heated to a very high temperature by the thin film deposition treatment have been recovered into the original slots or empty slots in the cassette after the cooling treatment (the post-treatment) of the wafers is carried out, the present invention should not be limited thereto. That is, the present invention may be applied to all cases where an object to be treated can not be recovered into a cassette unless the object existing in a treatment system is post-treated in a post-treatment chamber when the treatment system is restarted after the system is stopped.

In addition, the present invention can be also applied to a multi-chamber treatment system, which includes a treatment system for carrying out a predetermined treatment for an object to be treated, using, e.g., a gas harmful to the human body or a gas causing atmospheric pollution.

In the above described preferred embodiment, while the multi-chamber treatment system has comprised the two cassette chambers, the treatment chamber of the etching system, the treatment chambers of the two CVD system and the cooling chamber of the cooling system, all of which are connected to the common transfer chamber, the present invention should not be limited thereto, but the invention may be applied to any multi-chamber treatment systems, each of which comprises at least one treatment chamber, at least one post-treatment chamber, at least one cassette chamber, at least one positioning system and at least one transport system for transporting an object to be treated.

Moreover, in the above described preferred embodiment, while the etching treatment, the thin film deposition treatment, the cooling treatment (the post-treatment) have been sequentially carried out for the wafers, the present invention should not be limited thereto. For example, the object to be treated may be a glass substrate for a LCD. In addition, the present invention may be applied to any treatment systems for carrying out a predetermined post-treatment after carrying out a predetermined treatment requiring the post-treatment for an object to be treated.

According to the present invention, when a multi-chamber treatment system is restarted after being stopped during a treatment, an object to be treated, which requires a post-treatment, can be recovered into a cassette in a cassette chamber after a predetermined post-treatment is carried out, and an object to be treated, which requires no post-treatments, can be directly recovered into the cassette without carrying out the post-treatment. As a result, since the object requiring the post-treatment is recovered into the cassette after being surely post-treated, there is no bad influence on, e.g., the cassette. In addition, since the object requiring no post-treatment can be directly recovered into the cassette, the recovery of the respective objects in the treatment system can be rapidly carried out. Moreover, since the origin data and destination data of the objects during the treatment are always stored in the storage device, it is possible to accurately recover the objects. In addition, the objects are not recovered only into the original slots of the cassette, but the objects are also recovered into empty slots. Therefore, it is possible to more rapidly recover the objects, so that it is possible to return to an ordinary treatment process within a short time.

What is claimed is:

1. A method for recovering an object to be treated in a multi-chamber treatment system after a treatment procedure is interrupted, said multi-chamber treatment system comprising: at least one treatment chamber for carrying out a predetermined treatment for said object; at least one post-treatment chamber for carrying out a post-treatment required after said treatment; at least one cassette chamber; a common transfer chamber, which is in communication with said treatment chamber, said post-treatment chamber and said cassette chamber via gate valves and which has at least one transport system for transporting said object; memory means for storing transport destination information for said object, wherein said transport destination information indicates which one of the cassette chamber, the treatment chamber or the post-treatment chamber the object is to be transported, said method comprising the steps of:

determining whether said object is present in said treatment chamber or said post-treatment chamber when said transport system does not hold said object;

transporting said object from said post-treatment chamber to said cassette chamber in accordance with the transport destination information of said object, after said post-treatment is carried out for said object, when said object exists in said post-treatment chamber;

transporting said object from said treatment chamber to said post-treatment chamber when said object exists in said treatment chamber, when the transport destination information of said object is said post-treatment chamber, and transporting said object from said post-treatment chamber to said cassette chamber after said post-treatment is carried out for said object; and transporting said object from said treatment chamber to said cassette chamber when said object exists in said treatment chamber, when the transport destination information of said object is said cassette chamber.

2. A method for recovering an object to be treated, as set forth in claim 1, which further comprises the steps of:

determining an elapsed time from the interruption of the treatment procedure to a restarting of said treatment system; and recovering said object, which requires a post-treatment, into said cassette chamber without passing through said post-treatment chamber when said elapsed time is greater than a preset period of time.

3. A method for recovering an object to be treated, as set forth in claim 1, wherein said object is recovered into an original slot of a cassette in said cassette chamber in which said object was originally housed.

4. A method for recovering an object to be treated, as set forth in claim 1, wherein said object is recovered into an empty slot of a cassette in said cassette chamber.

5. A method for recovering an object to be treated, as set forth in claim 1, wherein said multi-chamber treatment system has a plurality of treatment chambers, each of which comprises a treatment chamber for carrying out a treatment requiring a post-treatment in said post-treatment chamber after a treatment, and a treatment chamber requiring no post-treatment in said post treatment chamber after the treatment.

6. A method for recovering an object to be treated, as set forth in claim 1, further comprising the steps of:

recognizing an origin data for said object when said transport system holds said object, wherein the origin data is stored before said treatment procedure is interrupted, and wherein said origin data has information indicating from which one of the cassette chamber, the treatment chamber and the post-treatment chamber the object has been transported; and recovering said object into said cassette chamber when said recognized origin data indicates that said object originated in said cassette chamber.

7. A method for recovering an object to be treated, as set forth in claim 1, further comprising the steps of:

recognizing said transport destination information for said object when said transport system holds said object, wherein the transport destination information is stored before said treatment procedure is interrupted; and recovering said object into said cassette chamber when said recognized transport destination information indicates that said object was being transported to said cassette chamber.

8. A method for recovering an object to be treated, as set forth in claim 1, further comprising the steps of:

recognizing destination data for said object when said transport system holds said object, wherein said destination data is stored before said treatment procedure is interrupted; and recovering said object into said cassette chamber when said recognized destination data indicates that the destination of said object is said cassette chamber.

* * * * *